United States Patent [19]

Sumi et al.

[11] Patent Number: 4,909,891

[45] Date of Patent: Mar. 20, 1990

[54] LAMINATOR

[75] Inventors: Sigeo Sumi, Saitama; Fumio Hamamura, Kanagawa; Noriyasu Sawada, Saitama; Ichio Fukuda, Tokyo, all of Japan

[73] Assignee: Somar Corporation, Tokyo, Japan

[21] Appl. No.: 116,819

[22] Filed: Nov. 5, 1987

[30] Foreign Application Priority Data

Nov. 6, 1986 [JP] Japan ................... 61-264235
Nov. 6, 1986 [JP] Japan ................... 61-264236
Nov. 6, 1986 [JP] Japan ................... 61-264237

[51] Int. Cl.$^4$ ............................................. B32B 35/00
[52] U.S. Cl. ................................. 156/497; 156/538; 156/543
[58] Field of Search ............... 156/497, 542, 552, 581, 156/583.1, 583.4, 538, 543

[56] References Cited

U.S. PATENT DOCUMENTS

| | | | |
|---|---|---|---|
| 2,589,756 | 3/1952 | Waters | 156/581 X |
| 3,779,838 | 12/1973 | Wech | 156/583.1 |
| 4,025,380 | 5/1977 | Bernardo | 156/497 X |
| 4,284,466 | 8/1981 | Chayka et al. | 156/583.1 |
| 4,469,545 | 9/1984 | Low | 156/583.1 X |
| 4,585,509 | 4/1986 | Obayashi | 156/497 |

Primary Examiner—Robert A. Dawson
Attorney, Agent, or Firm—Sughrue, Mion, Zinn, Macpeak & Seas

[57] ABSTRACT

A laminator for bonding a film onto a substrate is disclosed which comprises a film supply plate for supplying the film along a supply path, a film temporary bonding body and a film temporary bonding edge member for temporarily bonding the film in pressing contact with the substrate. The film temporary bonding edge member is detachably provided on the film temporary bonding body. A first heat insulator is interposed between the film temporary bonding body and the film temporary bonding edge member. The temporary bonding body is detachably provided at a leading end of the film supply path of the film supply plate. A second insulator is interposed between the film supply plate and the film temporary bonding body.

6 Claims, 12 Drawing Sheets

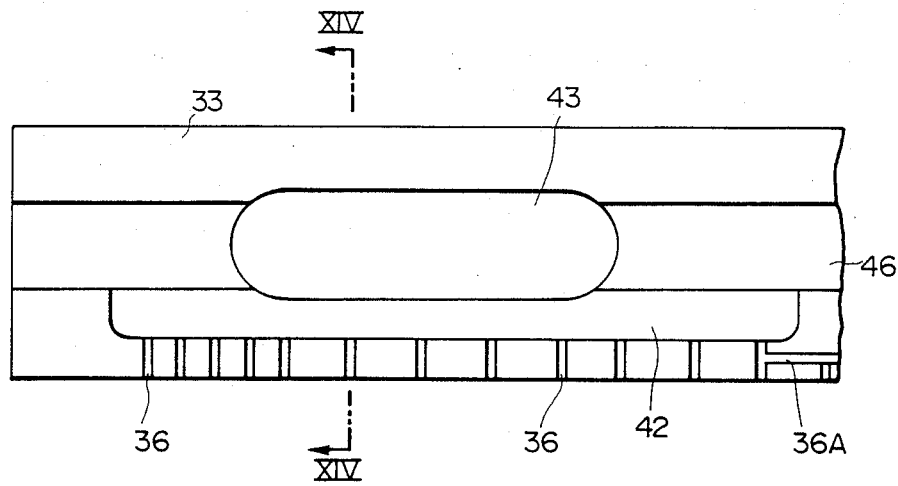
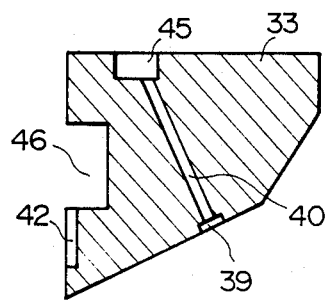
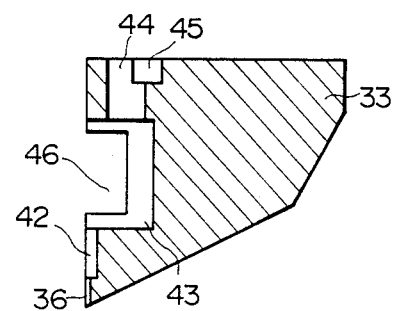
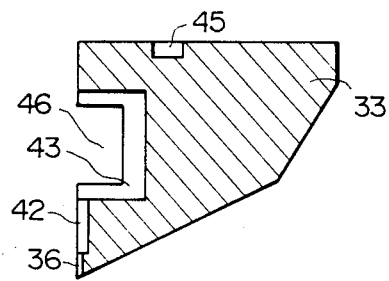

LAMINATOR

BACKGROUND OF THE INVENTION

The present invention relates to a laminating technique and, in particular, to a technique that is effectively applied to a laminator of the type that cuts a continuous thin film to a predetermined size and laminates it over a substrate.

Printed circuit boards used in electronic equipment such as a computers are formed by depositing a predetermined pattern of wires of conductive materials such as copper on one or both sides of an insulating substrate.

Printed circuit boards of this type can be manufactured by the following process.

First, an assembly of a photosensitive resin layer (photoresist) and a transparent resin layer (protective film) is laminated over an electro-conductive layer on the insulating substrate by thermo-compression. This step is commercially carried out with a device called a laminator. Thereafter, a film with a wiring pattern is superposed on the assembly and the photosensitive resin layer is exposed to light for a predetermined period of time through the patterned film and the transparent resin film. Subsequently, the transparent resin film is stripped with a peeler and the exposed photosensitive resin layer is developed to form a mask pattern for etching. Thereafter, the unwanted areas of the conductive layer are etched away and any residual photosensitive layer is removed to produce a printed circuit board having a predetermined wiring pattern.

In the foregoing manufacturing process for the printed circuit boards, it is necessary to provide a step for thermocompression of laminates in an automatic manner by a thin film laminator. The thermocompression laminating process is outlined as follows:

First, a laminate wound continuously on a supply roller of the thin film laminator is supplied to a board or substrate by means of a main vacuum plate. A plurality of absorption holes are formed in a laminate supply surface of the main vacuum plate, so that the laminate is sucked and supplied by the absorption holes. A leading end of the laminate assembly supplied to the substrate is temporarily bonded to a conductive layer of the insulative substrate by an arcuate portion of a temporary bonding portion provided on the leading end side of the main vacuum plate (temporary bonding). The leading end of the laminate may be sucked to the temporary bonding portion by a subvacuum plate that may be close to or away from the laminate supply path. The main and sub vacuum plates are mounted on the laminator body through a support member that may be close to or away from the substrate in order to carry out the supply and temporary bonding operation of the laminate.

Subsequently, the laminate with the leading end being temporarily bonded is thermocompressed onto the substrate by a thermobonding roller. If the laminate is laminated to the substrate to some extent, then the laminate is cut in a predetermined length corresponding to the length of the substrate by means of a cutter. The cutter is provided to the above-described support member together with the main and sub vacuum plates.

However, in such a laminator, if the arcuate temporary bonding portion provided on the supply leading end side of the main vacuum plate would be damaged, it would be necessary to replace the main vacuum plate as a whole by a new one.

Also, when the leading end of the thin film laminate is temporarily bonded to the conductive layer of the insulative substrate by the arcuate temporary bonding portion provided on the supply leading side of the main vacuum plate, a portion other than the temporary bonding portion would be heated so that the photo resist layer (light-sensitive resin layer) would be viscous. This would generate bubbles or the like in the laminated thin film, resulting in fault of bonding.

SUMMARY OF THE INVENTION

Accordingly, in order to overcome the above-noted defects, according to the present invention, there is provided a film temporary bonding device for a laminator for bonding a film onto a substrate, comprising a film temporary bonding edge member for temporarily bonding the film onto the substrate, and a film temporary bonding body to which the film temporary bonding edge member is detachably bonded.

According to the invention, a device for temporarily bonding a film onto a substrate for a laminator, comprising: means for supplying the film along a supply path; a film temporary bonding body means; a film temporary bonding edge means for temporarily bonding the film, to be bonded onto the substrate, in pressing contact with the film; means for detachably coupling the film temporary bonding edge means and the film temporary bonding means to each other; a first heat insulator means for insulating heat, the first heat insulator means being interposed between the film temporary bonding body means and the film temporary bonding edge means; means for detachably coupling said film temporary bonding body means and said film supplying means to each other; and a second heat insulator means for insulating heat, the second heat insulator means being interposed between the film supplying means and the film temporary bonding body means.

Another aspect of the invention, there is provided a laminator for bonding a film onto a substrate, comprising: film supply means for supplying the film along a supply path; and film temporary bonding means for temporarily bonding the film, to be bonded onto the substrate, the film temporary bonding means including; a film temporary bonding body; a film temporary bonding edge member for temporarily bonding the film, to be bonded onto the substrate, in pressing contact with the film the film temporary bonding edge member being detachably provided on said film temporary bonding body; a first heat insulator, the first heat insulator being interposed between said film temporary bonding body and the film temporary bonding edge member, the temporary bonding body being detachably provided at a leading end of the film supply path of film supply means; and a second insulator interposed between film supply means and said film temporary bonding body.

The invention includes film absorbing means for independently sucking fluid in film sucking holes formed in the film supply means and film sucking holes formed in the film temporary bonding body.

BRIEF DESCRIPTION OF THE DRAWINGS

FIG. 11 is a plan view as viewed in a direction XI in FIG. 9;

FIG. 12 is a cross-sectional view taken along the line XII—XII of FIG. 10;

FIG. 13 is a cross-sectional view taken along the line XIII—XIII of FIG. 10;

FIG. 14 is a cross-sectional view taken along the line of XIV—XIV of FIG. 11;

DETAILED DESCRIPTION OF THE PREFERRED EMBODIMENTS

Embodiments of the present invention in which it is applied to a laminator for thermocompression laminating an assembly of a photosensitive resin layer and a transparent resin film onto a printed circuit board is hereinafter described specifically with reference to the accompanying drawings.

In the accompanying drawings, intended for illustrating the embodiment, components that achieve the same function are identified by the same numerals and redundant explanation of such components will be omitted.

Figure 1:
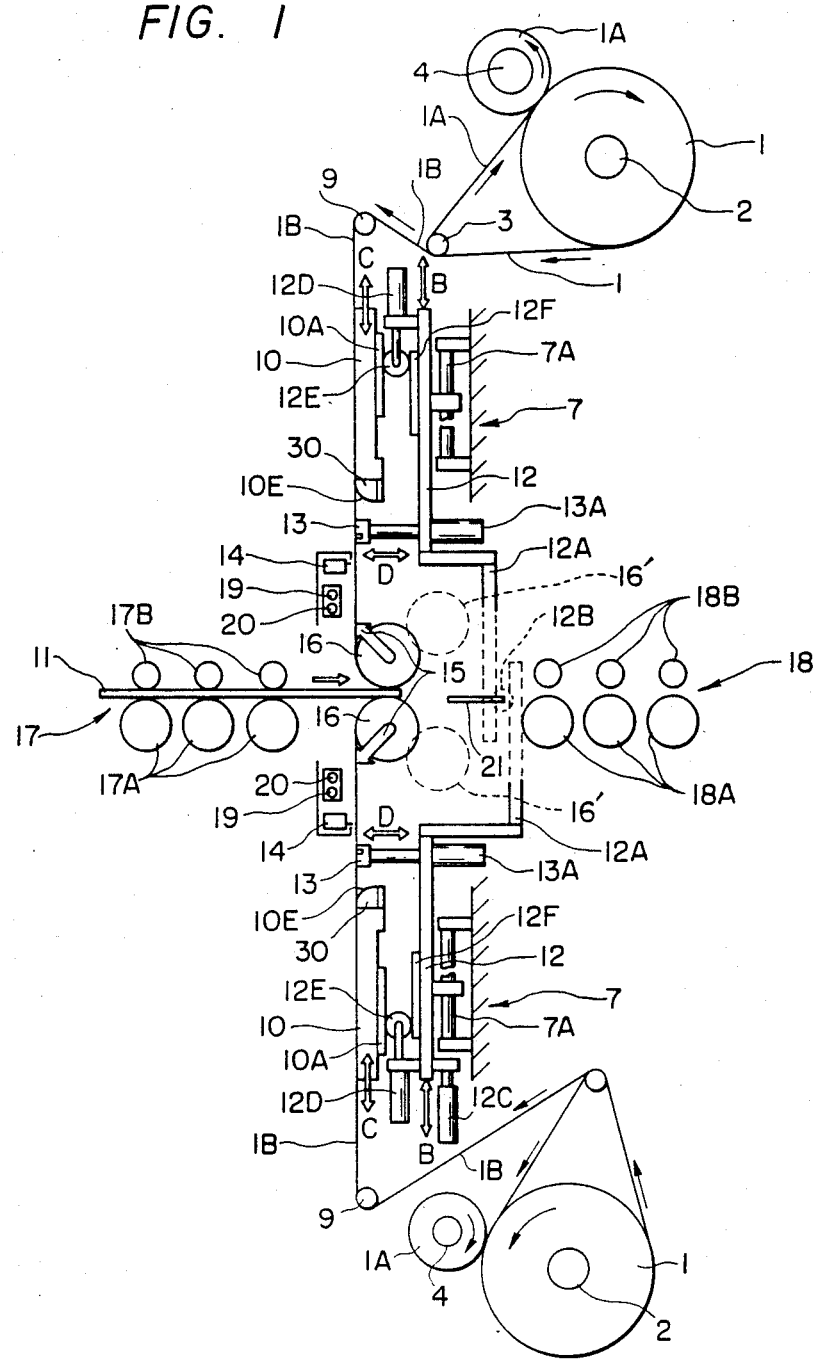
FIG. 1 is a schematic illustration showing laminator according to one embodiment of the present invention.

A laminator according to a first embodiment of the present invention is shown schematically in FIG. 1.

As shown in FIG. 1, an assembly 1 of three layers, i.e., a transparent resin film, a photosensitive resin layer, and another transparent resin film, is wound around a feed roller 2 by which the assembly 1 is separated by a separation roller 3 into one transparent resin film (protective film) 1A and an assembly 1B composed of photosensitive resin layer with its adhesive surface exposed and the other transparent resin film. The transparent resin film 1A is wound onto a takeup roller 4.

Figure 2:
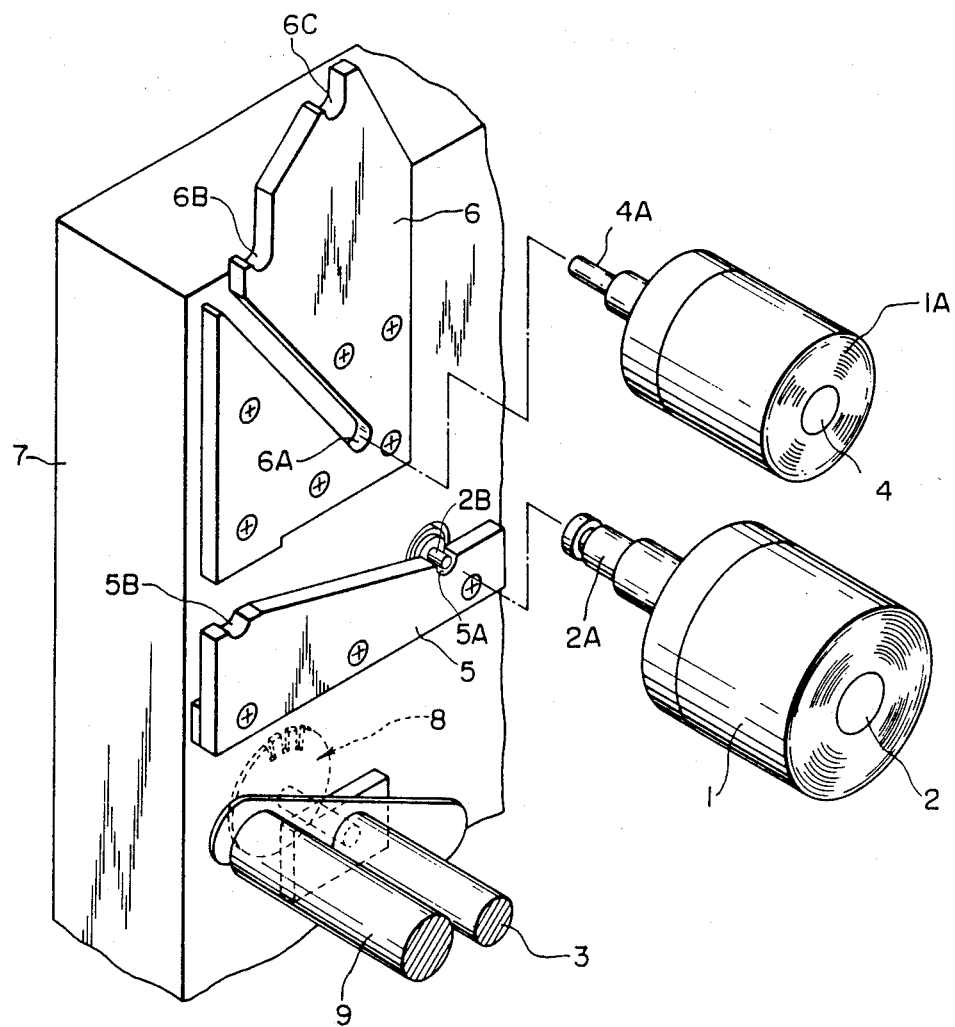
FIG. 2 is a perspective view showing an essential portion of FIG. 1.

The feed roller 2 has a shaft portion 2A engaged with an arcuate recess 5A, and is supported by a roller support member 5 as shown in FIG. 2 (perspective view showing an essential portion). The roller support member 5 is fixed to an outside portion of a cover frame of a laminator body 7 by means of a connection member such as a screw (or adhesive agent).

The take up roller 4 has a shaft portion 4A engaged with a U-shaped recessed portion 6A, and is supported by a roller supporting member 6. The roller supporting member 6 is fixed to the outer side of the cover frame of the laminator body 7 in a manner similar to the roller support member 5.

The roller support member 5 is formed with an arcuate recessed portion 5B as a temporary installing place of the feed roller 2 at a leftward position (a position adjacent to an operator). On the other hand, the roller support member 6 is formed with arcuate recessed portions 6B and 6C as temporary installing places for the take up roller 4 at a rightward position (a position far away from the operator).

These arcuate recesses 5A, 5B, 6B and 6C in the roller support members 5 and 6 are so employed as temporary installing places. In case the assembly 1 is used up and the feed roller 2 is replaced by a new one, the shaft portion 4A of the take-up roller 4 is disengaged from the u-shaped recess 6A and is engaged with one of the recesses 6A and 6C those being the temporary installing places. With the state being maintained, the shaft portion 2A of the feed roller 2 is disengaged with the arcuate recessed portion 5A and is engaged with the arcuate recess 5B which functions as the temporary installing spot. Thereafter, the roller 2 is removed from the roller supporting member 5. Then, a new feed roller 2 is provisionally engaged with the circular recessed portion 5B, and thereafter, is moved to and engaged with the arcuate recessed portion 5A. Subsequently, by the action of the air cylinder, a rod member 2B is engaged with the shaft portion 2A. Then, the shaft portion 4A of the take-up roller 4 engaged with one of the circular recessed portions 6B and 6C is shifted to allow engagement with the U-shaped recessed portion 6A.

The roller support member 5 is provided with the circular recessed portion 5A or 5B as the temporary installing spot, and the roller support member 6 is formed with circular recessed portions 6B and 6C as the temporary installing spots. Therefore, it is unnecessary to completely disassemble the feed roller 2 and the take-up roller 4 those having heavy weights from the laminator body. Rather, these rollers are only displaced by short distance, yet performing attachment and detachment of the rollers. In other words, workability is enhanced, and working safety can be improved when using the laminator.

Figure 3:
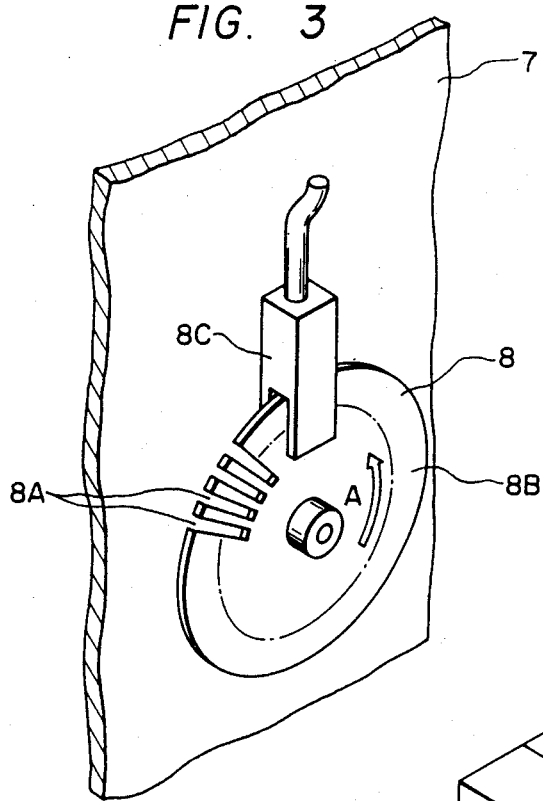
FIG. 3 is an enlarged perspective view showing an essential portion of a thin film supply detection means shown in FIG. 2.

At one end portion of the separation roller 3, a thin film supply detection device 8 is provided as shown in FIGS. 2 and 3 (enlarged perspective view showing an essential portion). The thin film separation roller 3 is located at a supply path of the assembly 1, and the thin film supply detection device 8 is disposed in a supply path of the assemblies 1A and 1B (a path bridging between the feed roller 2 and the substrate). The thin film supply detection means 8 is rotated in a direction shown by an arrow A by the rotation of the thin film separation roller 3, and includes an encoder comprising a rotary disc plate 8B whose circumferential portion is formed with slit portions 8A and a detecting portion 8C for detecting the slit portion 8A. That is, the thin film supply detection means 8 is constructed to generate output signal in response to a rotation number of the thin film separation roller 3. The rotary disc 8B is formed of, for example, resin material, light metal, alloy, etc. the detecting portion 8C is so constructed as to detect the slit portion 8A by means of light, ultrasonic wave, etc. The thin film supply detection means 8 is disposed in the cover frame of the laminator body 7 at a position offset the supply path of the assemblies 1 and 1B so as not to interfere the passing thereof.

By disposing the thin film supply detection means 8 at the supply path of the assemblies 1 and 1B, supplying condition of the assembly 1 and 1B is detected at supply phase thereof. That is, the thin film supply detection means 8 detect the supplying conditions when the assembly 1 or 1B is supplied at temporary thermo-compression operation, thermo-compression lamination operation, cutting operation of the assembly 1B, etc. If the supply of the assembly 1 or 1B is not precisely carried out, an output signal from the detection portion 8C operates and alarming device (not shown), so that the operator can notice the operation accident. Further, the laminator operation is automatically terminated. That is, the laminator can improve yieldability for producing printed circuit board.

Incidentally, the thin film supply detection means 8 can be placed at any location in the supply path of the assembly 1 and 1B. However, it is advantageous that the detection means 8 is placed on the thin film separation roller 3. That is, the thin film separation roller does not necessarily provide complicated structure, and the roller 3 does not require any movement other than rotation. Therefore, the thin film supply detection means 8 can easily be disposed on the roller 3.

The leading edge of the assembly 1B that has been separated from the protective film 1A by the separation roller 3 will pass on a tension roller 9 to be sucked onto a main vacuum plate 10.

The tension roller 9 is so designed that it will impart an appropriate amount of tension to the laminate assembly 1B as it is supplied from the feed roller 2 to the main vacuum plate 10 or to a thermbonding roller 16. In other words, the tension roller 9 serves to keep the assembly 1B taut without developing any surface detects such as wrinkles.

Figure 4:
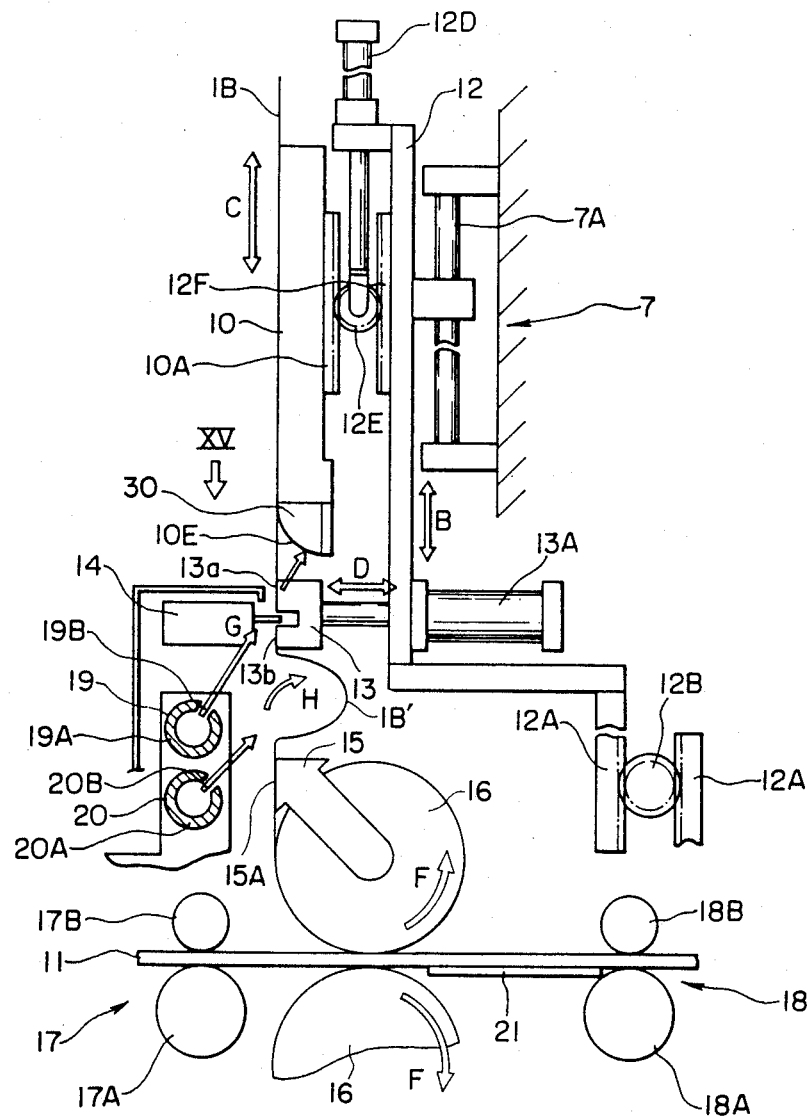
FIG. 4 is an enlarged illustration showing an essential portion of FIG. 1.

The main vacuum plate (film supply member) 10 is so designed that it allows the assembly 1B to be supplied from the roller 2 onto an electro-conductive layer (for example copper layer) on the surface of an insulating substrate 11. The main vacuum plate 10 is supported by a support member 12 that is movable toward or away from the insulating substrate 11 (viz., the support member 12 moves in the direction indicated by arrow B as shown in FIGS. 1 and 4 (enlarged view showing an essential portion). The support member 12 is disposed in the laminator body 7 (housing of the laminator body) so as to allow the guide member 7A to be slidable in a direction shown by an arrow B. A pair of the support members 12 are provided, each one of the members being disposed at upper and lower sides with respect to the travelling path of the insulating substrate 11. The upper and lower supporting members 12 are cooperably moved by a rack and pinion mechanism, so that the members 12 are moved simultaneously (toward and away from each other). That is, the upper and lower supporting members 12 are respectively provided with a rack 12A and a pinion 12B engaged with the rack 12A. The supporting members 12 are operated by a drive source 12C disposed to the lower supporting member 12. The drive source 12C may be, for example, a pneumatic cylinder. Further, the drive source 12C can be provided by a hydraulic cylinder, an electro-magnetic cylinder, or a step motor and a power transmission mechanism which transmits displacement of the cylinder or motor.

The main vacuum plate 10 is disposed on the support member 12 so as to move toward and away from the insulation substrate 11 (in a direction shown by an arrow C). The main vacuum plate 10 is operated by a drive source 12D disposed to the support member 12 and a rack and pinion mechanism. The rack and pinion mechanism includes a pinion 12E disposed to the drive source 12D, a rack 12F disposed to the support member 12, and the rack 10A disposed to the main vacuum plate 10. The drive source 12D would be similar to the drive source 12C.

Figure 5:
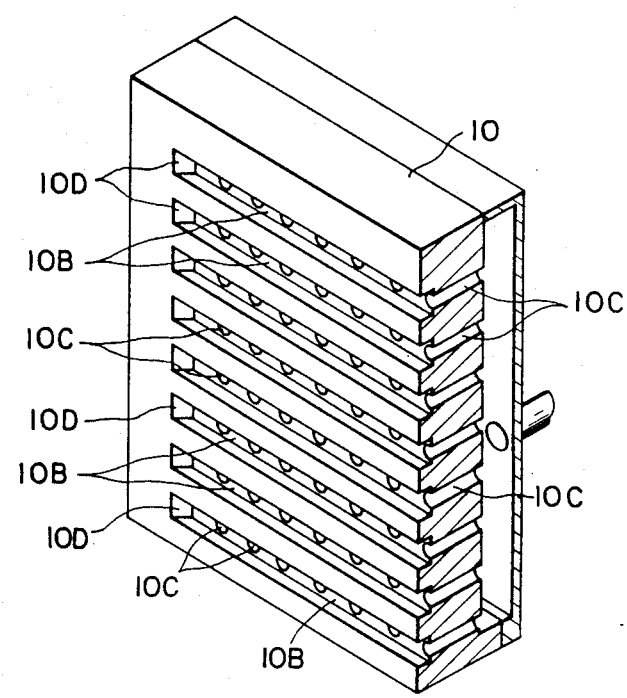
FIG. 5 is a perspective view partially in crosssection showing a main vacuum plate shown in FIGS. 1 and 4.

The main vacuum plate 10 shown in FIG. 5 (a perspective view of a partial section of the main vacuum plate 10) is provided with a plurality of grooves 10B that extend transversally in a direction generally orthogonal to the direction of supply of the assembly 1B and which are arranged in the direction in which the assembly 1B i conveyed. The length of each groove 10B as measured in the direction transverse to the direction in which the assembly 1B is supplied is somewhat greater than a maximum width of the assembly 1B as measured in that transverse direction, so that the assembly 1B will cover each groove 10B. Although not shown, each suction hole 10C is connected through an exhaust pipe to a vacuum source such as a vacuum pump. Both ends 10D of each groove 10B are tapered from the margin of the main vacuum plate 10 toward its center. The tapered ends 10D are so designed that the ends of the assembly 1B will be positioned in registry therewith when it is sucked onto the main vacuum plate 10.

At the leading end of the main vacuum plate 10 with respect to the supply direction of the laminate assembly 1B, there is provided a temporary bonding member 30 having an arcuate surface for sucking the assembly 1B. The temporary bonding member 30 is attached thereto through a heat-insulative material 31 made of plastics such as phenol resin by means of screws 50. The temporary bonding member 30 is composed of a temporary bonding member body 33 and a temporary bonding edge member 34. The temporary bonding edge member 34 is detachably mounted on the temporary bonding body 33 through a heat-insulative member 31 made of plastics or the like by means of fastening screws 52. The edge portion 34A of the edge member 34 for temporary bonding the laminate assembly 1B onto the insulative substrate 11 is in the form of an elongated strip having a width of, for example, 1.5 mm. A heater 35 for heating the edge portion 34A is provided in the temporary bonding edge member 34 on the side of the temporary bonding body 33. The heat insulative material 31 is provided to a projected portion due to the provision of the heater 35 toward the thin film temporary bonding body 33.

Figure 6:
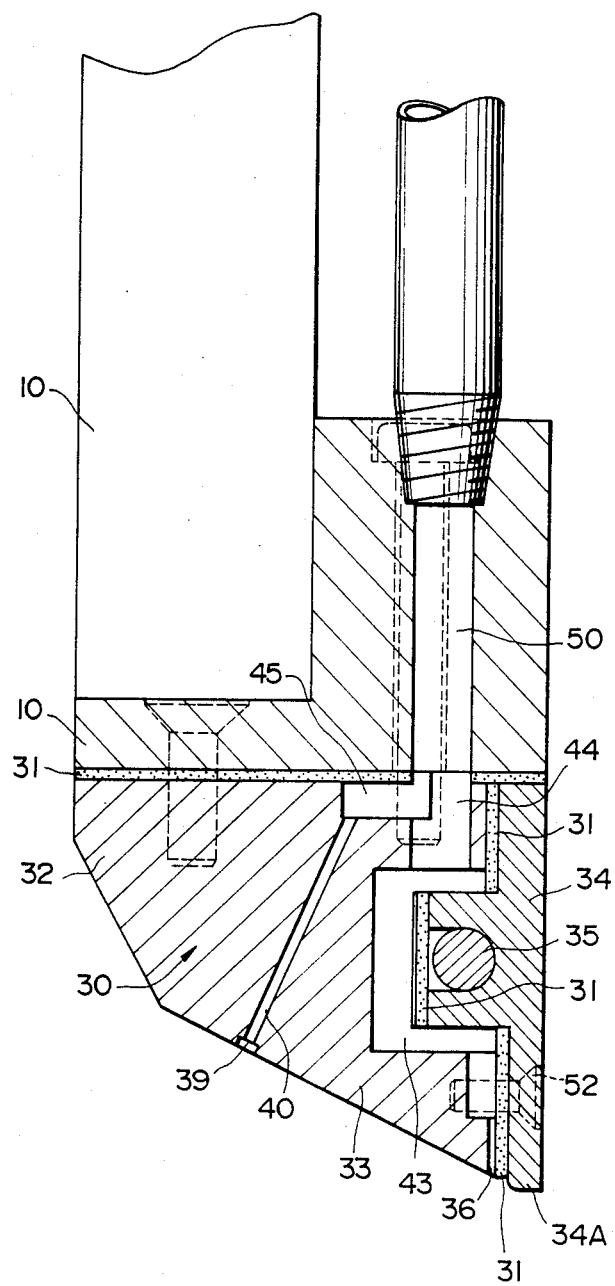
FIG. 6 is a cross-sectional view showing the temporary bonding portion shown in FIGS. 1 and 4.
Figure 7:
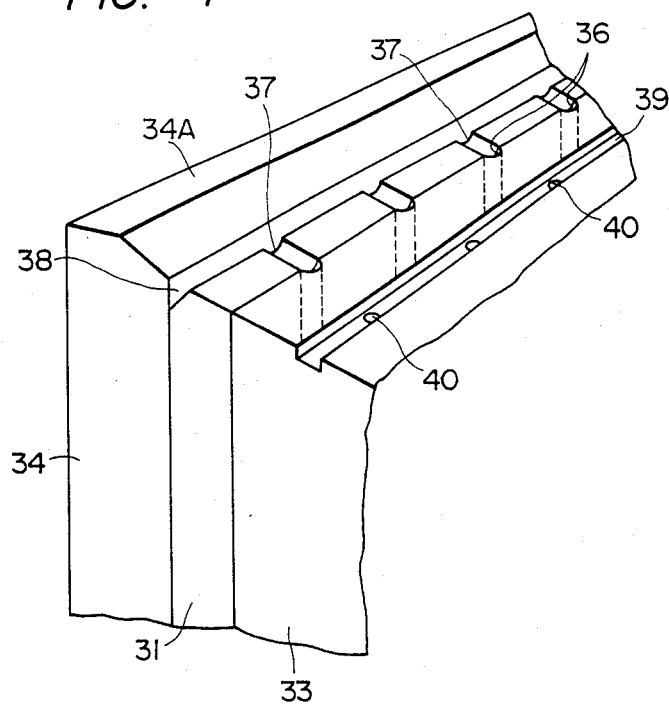
FIGS. 7 and 8 are perspective views showing primary a temporary bonding edge portion of parts of a main vacuum plate, which may be used in the laminator shown in FIGS. 1 and 4.

As shown in FIGS. 6 and 7, in the structure of the film temporary bonding member 30 by which the assembly 1B is bonded temporarily to the insulative substrate 11, a plurality of film sucking passages. 36 are formed in an interface portion between the film temporary bonding member body 33 and the heat insulative material 31. Film sucking grooves 37 in communication with the film sucking passages 36 are formed in an exposed portion of the heat insulating material 31. A film sucking groove 38 is also formed in the exposed portion of the heat insulative material 31 along the edge member 34.

Also, a film sucking groove 39 and a plurality of film sucking holes 40 are formed in the film temporary bonding member body 33. The film sucking passages 36 and the film sucking holes 40 are evacuated by a single film sucking means (not shown). This is controlled independently of the sucking source of the main vacuum plate 10.

Thus, the film sucking passages, grooves and holes 36 to 40 cause the temporary bonded portion of the laminate body 1B to be located exactly on the edge portion 34A.

Figure 8:
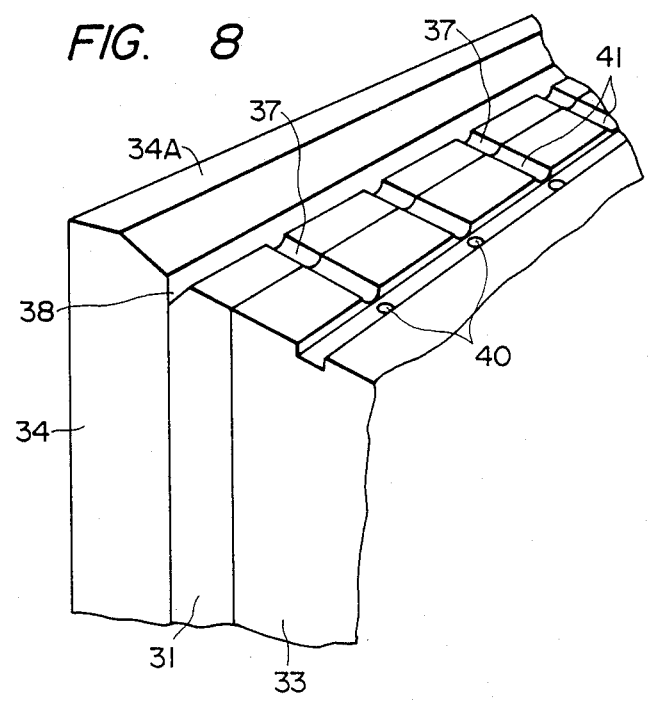

It is possible to dispensed with the film sucking passages 36 as shown in FIG. 8. Instead thereof, the sucking recesses 37 are extended to merge into film sucking recesses 41 which are formed in the exposed surface of the temporary bonding body member 33 toward the insulative substrate 11. The sucking recesses 41 are in communication with the sucking holes 40. With such an arrangement, it is possible to ensure the same effect.

In more detail, the structure of the film temporary bonding body 33 will be explained with reference to FIGS. 9 to 14.

Figure 9:
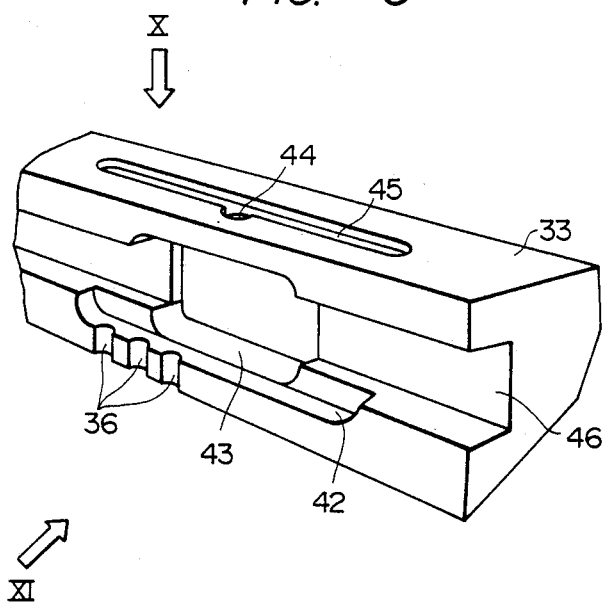
FIG. 9 is a perspective view showing a primary part showing a film bonding body shown in FIG. 6.
Figure 10:
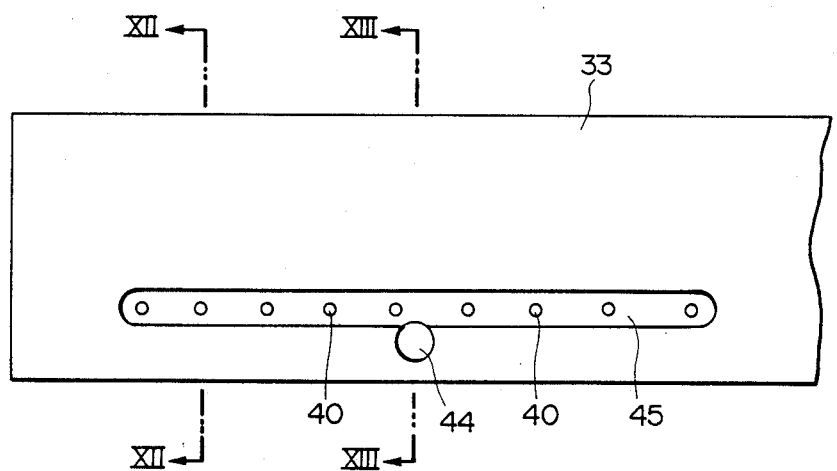
FIG. 10 is a plan view as viewed in a direction X in FIG. 9.

As shown in FIGS. 7, 9 and 11, a plurality of sucking passages 36 are formed inwardly along the interface between the temporary bonding body 33 and the heat insulator 11. There is provided an air stagnation first cavity 42 formed in communication with the film sucking passages 36. As best shown in FIGS. 13 and 14, an air stagnation second cavity 43 is deeply formed in communication with the first cavity 42. A vent hole 44 is formed in communication with the second cavity 43 and passes toward the main vacuum plate 10. The vent hole 44 is in communication with an air stagnation third cavity 45 formed in a surface portion toward the main vacuum plate 10. On the other hand, the vent holes 40 are formed in the central portion of the film temporary bonding body 33 toward the main vacuum plate 10. The vent holes 40 are in communication with the air stagnation third cavity 45 formed in the surface portion confronted with the main vacuum plate 10.

A plurality of such film sucking means for sucking the laminate assembly 1B are formed in the film temporary bonding body 33 and are driven independently of each other in response to a width of the assembly 1B, so that the assembly 1B may be absorbed more strongly to the film temporary bonding body 33 by the independent and selective operations of the film sucking means. As a result, the temporary bonded portion may be positioned exactly at the edge portion 34A.

Also, as shown in FIGS. 9, 11 to 13, a heater receiving groove 46 having a predetermined depth is provided in a center line portion of the film temporary bonding body 33 toward the film temporary bonding edge member 34. The heater 35 provided in the film temporary bonding edge member 34 is received in the heater receiving groove 46.

As described before, the film temporary bonding member 30 is thus formed. Even if the temporary bonding portion of the film temporary bonding edge member 34 is damaged in abutment with the laminate assembly 1B to be laminated on the insulative substrate 11, it is possible to remove the temporary bonding edge member 34 away from the temporary bonding body 33. Therefore, it is unnecessary to replace the main vacuum plate 10 as a whole.

Also, the film temporary bonding edge member 34 for temporarily bonding the thin film thereto in pressure contact with the film to be laminated on the insulative substrate 11 is detachably mounted to the film temporary bonding body 33 through the heat insulator 31. Accordingly, it is possible to heat the film temporary bonding edge member 34 solely and to prevent the propagation of the heat to the other parts. It is therefore possible to prevent the light sensitive resin (photo resist) layer from being viscous and to allow the portion of the film to be thermobonded to a predetermined portion. Thus, it is possible to prevent bubbles or the like from being generated in the thermobonded film with fault in bonding.

A sub-vacuum plate 13 (thin film retaining member) is provided in a area near the temporary bonding portion 30, namely in the vicinity of the pathway of supply of assembly 1B between the bonding portion 30 and the substrate 11. Although not shown, the sub-vacuum plate 13 is also provided with suction holes and it is composed of an upper sucking portion 13a and a lower sucking portion 13b to provide a U-shaped form as shown in FIG. 4 (the U-shaped portion is positioned at a cutting position of the assembly 1B). The upper sucking portion 13a of the sub-vacuum plate 13 chiefly serves to have the leading edge of the assembly 1B sucked so that it is sucked (and retained) on the temporary bonding portion 10E. In order to enable the leading edge of the assembly 1B to be sucked onto the bonding portion 10E, the sub-vacuum plate 13 is mounted on the support member 12 and operated with a drive source 13A which may be in the form of an air cylinder that is movable toward or away from the pathway of the supply of assembly 1B (i.e., moved in the direction of arrow D).

The lower sucking portion 13b of the sub-vacuum plate 13 is so constructed that after a continuous form of assembly 1B has been cut with a cutting unit 14, the resulting segment of assembly is sucked at its trailing edge and retained within the pathway of the supply of assembly 1B. This lower sucking portion 13b is also constructed in such a way that after the start of thermocompression lamination, as shown in FIG. 4, a slack will form in that portion of the assembly 1B which is situated between 13b and a rotary vacuum plate 15 (namely, a slack assembly 1B' can be formed by supplying the assembly 1B on the main vacuum plate 10 at a speed that is so controlled as to be faster than the peripheral speed of a thermocompression roller 16 (viz., the speed of thermocompression lamination). Although not shown, the speed at which the assembly is supplied on the main vacuum plate 10 and the peripheral speed of the roller 16 are controlled by a sequence control circuit.

As in the case of drive source 12C, the drive source 13A for sub-vacuum plate 13 may be in the form of a hydraulic cylinder or the like in place of an air cylinder.

The cutter unit 14 is provided in the laminator body 7 in an area near the pathway of the assembly 1B passing between the temporary bonding portion 10E and the insulating substrate 11 (in fact, between the temporary bonding station 10E and the rotary vacuum plate 15). Stated more specifically, the cutter unit 14 is disposed to face the sub-vacuum plate 13 with the trailing end of the assembly 1B being brought into a cutting position. The cutter unit 14 is disposed at the side of a front stage transferring device 17 which transfers the insulating substrate 11 (alternatively, the unit 14 is disposed on the device 17). The cutter unit 14 is to constructed that the assembly 1B which is continuously supplied on the main vacuum plate 10 is cut to a predetermined length in accordance with the dimensions of the substrate 11.

Figure 15:
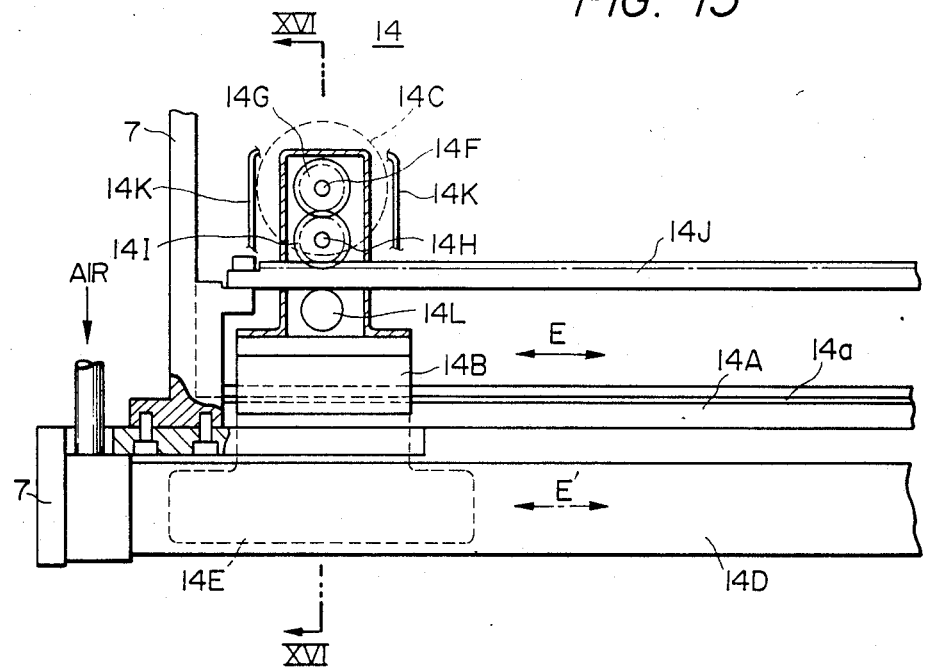
FIG. 15 is a cross-sectional view taken along the line XVI—XVI.
Figure 16:
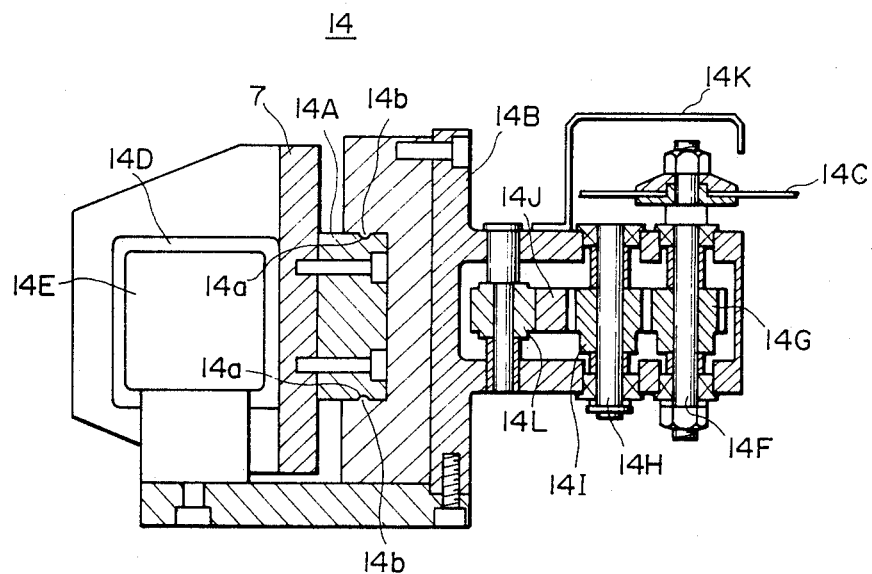
FIG. 16 to 19 are enlarged illustrations showing essential portion of FIG. 1 in each steps of termocompression lamination method.

The construction of the cutter unit 14 is specifically shown in FIG. 15 which is a schematic plan view of this cutter unit looking in the direction of arrow XV in FIG. 4, and in FIG. 16 which shows a section of the cutter unit as taken on line XVI—XVI in FIG. 15.

As is apparent from FIGS. 15 and 16, the cutter unit 14 is chiefly composed of a guide member 14A, a moving member 14B and a disk-shaped cutter 14C.

The guide member 14A extends transversal to the direction in which the assembly 1B is supplied and both ends (or one end) of the member 14A are secured to the laminator body 7 by such fastening means as screws, bolts, nuts and adhesives. In order to ensure correct movement of the moving member 14B, in the direction transversal to that of the supply of assembly 1B (i.e., the direction of an arrow E in FIG. 15), the guide member 14A is provided with recesses (or projections) 14a that engage correspondingly shaped projections (or recesses) 14b formed on the moving member 14B.

The moving member 14B is so constructed that it will slide along the guide member 14A in a direction shown by an arrow E. This moving member 14B is connected to a slider 14E that will move in the direction of arrow E' within a hollow tube 14D that extends along the guide member 14A and which is supported at both ends to the laminator body 7. Movement of the slider 14E is effected by blowing a fluid such as air into the hollow tube 14D (or drawing such fluid from the tube), through either end thereof. In other words, the slider 14E will be moved from left to right in FIG. 15 when a fluid is blown into the hollow tube 14D from its left side, and will be moved in opposite direction when the fluid is blown from the right side. The slider 14E is so designed as to displace the moving member 14B. In place of air, a gas such as an inert gas or a liquid such as water or oil may be blown into the hollow tube 14D. Alternative means for effecting displacement of the moving member 14B include air cylinder, a hydraulic cylinder and a motor.

The disk-shaped cutter 14C is rotated as the moving member 14B is displaced and at least its periphery is provided with a blade for cutting the assembly 1B. The force to rotate the disk-shaped cutter 14C is imparted by the combination of a pinion 14g on an axis 14F and a gear wheel 14I on an axis 14H that meshes with a rack 14J. One or both ends of the rack 14J are secured to the laminator body 7. The engagement between the rack 14J and the gear wheel 14I is stabilized by means of a retainer roller 14L that is mounted on the moving member 10B.

The disk-shaped cutter 14C is made of a metallic material such as a high-speed tool steel and at least the surface of the blade is coated with polytetrafluoroethylene. Polytetrafluoroethylene is highly inert to chemicals and has superior heat stability; in addition, this resin has a small coefficient of friction and will not readily adhere to other materials. In laminators, repeated cutting of the assembly 1B will produce shavings that are composed of tiny particles and which contain various chemicals. If such shavings adhere to the blade of the disk-shaped cutter 14C, its cutting performance will be easily deteriorated. This problem can be effectively solved by coating a film of polytetrafluoroethylene on the blade surface.

The moving member 14B in the neighbourhood of the disk-shaped cutter 14C is provided with a protective cover 14K over the cutter 14C that is chiefly intended to ensure utmost safety for the operating personnel.

The cutting unit 14 described above is so constructed that in response to the sliding of the moving member 14B along the guide member 14A in one direction, the disk-shaped cutter 14C is rotated to cut the assembly 1B to a size that corresponds to the length of the insulating substrate 11. The assembly 1B can be cut by moving the disk-shaped cutter 14C in one direction and this enables rapid cutting of the assembly 1B.

In the above-described laminator, the main vacuum plate 10 and the sub-vacuum plate 13 are mounted on the laminator body 7 via. the support member 12 that is movable toward or away from the substrate 11, and the cutting unit 14 for cutting the assembly 1B is secured to the laminator body 7 in an area near the pathway of supply of the assembly 1B between the temporary bonding portion 10E and the substrate 11. This arrangement is effective in reducing the weight of the members 12 and thereby allowing the member 12 to be driven with the drive source 12C that may have a small driving capability (or capacity).

The above-described arrangement is also effective in reducing the members of mechanical parts that have to be supported by the support member 12 and thereby simplifying the layout of the support member 12 and associated components thereof so as to reduce the overall size of the laminator.

The reduction in the size of drive source 12C and other components offers the additional advantage of decreasing the production cost of the laminator.

The cutting unit 14 which achieves its function by moving the disk-shaped cutter 14C may be in the form of a beam cutter that employs an appropriate means such as ultrasonic waves or a laser beam. Alternatively, the cutting unit 14 may be in the form of a cutter, such as a quillotine cutter, a band-shaped cutter, a wire-shaped cutter (which may or may not be heated) or knife-shaped cutter, that has a blade extending transversely to the direction of supply of the assembly 1B and which is generally equal to or larger than the transversal dimension of the assembly 1B. Whichever type of cutter may be chosen, the cutting unit 14 is capable of cutting through the desired area of the assembly in a single action.

The assembly 1B whose leading edge has been temporarily bonded (thermo-compression bonded) to the conductive layer on the insulating substrate 11 by means of the temporary bonding portion 10E of the main vacuum plate 10 is subsequently laminated over the substrate by thermo-compression with the roller 16. When the leading edge of the assembly 1B is being bonded temporarily to the conductive layer by means of the temporary bonding portion 10E, the thermo-compression roller 16 is rotating on the position indicated by the dashed line 16' in FIG. 1. Thereafter, the roller 16 is so constructed that it will not come in contact with the bonding portion 10E during the temporary bonding operation. After the temporary bonding operation, the roller 16 will be shifted from the position indicated by the dashed line 16' to the position indicated by the solid line, or where the insulating substrate 11 carrying the assembly 1B on both sides is held between upper and lower thermo-compression rollers 16. The roller 16 will then be rotated in the direction indicated by arrow F in FIG. 4, such that they will convey the insulating substrate 11 as the assembly 1B is thermocompression laminated over the conductive layer on the substrate. As long as the step of thermo-compression lamination is being carried out, the mode of sucking the assembly 1B onto the main vacuum plate 10 or sub-vacuum plate 13 is turned off, and the assembly 1B is automatically supplied from the feed roller 1 by the rotating force of the rollers 16 and the retaining force provided by these rollers and the substrate 11.

The trailing edge of the assembly 1B that has been cut with the cutting unit 14 will be guided by a triangular rotary vacuum plate 15 such that it will not develop any wrinkles or other surface defects and that it will be correctly thermo-compression laminated with the rollers 16. The rotary vacuum plate 15 is rotatably supported on the shaft of each thermo-compression roller 16 and a plurality of suction holes 15A are provided in the sucking surface of the plate 15 which is inconfrontation with the assembly 1B. The sucking surface provided with the suction holes 15a is constructed in the same manner as the sucking surface of the main vacuum plate 10 shown in FIG. 5. Although not shown, suction holes may also be provided in the top surface of the rotary vacuum plate 15 and this layout has the advantage of providing a slack assembly 1B' of the shape shown in FIG. 4.

The substrate 11 is conveyed to the temporary bonding position of the laminator by means of the front-stage conveyor 17 that is composed of lower transport rollers (lower stage) 17A and upper transport rollers (upper stage) 17B. After the assembly 1b has been laminated over the substrate 11 by means of rollers 16 in the laminator, the substrate will be conveyed to an exposure unit for producing a patterned wiring with a rear-stage conveyor 18 that is composed of (lower) transport rollers 18A and (upper) transport rollers 18B.

A thin film adjusting unit 19 is provided as shown in FIGS. 1 and 4 on the laminator body 7 (or front-stage conveyor 17 or support member 12) in an area near the pathway (of thin film supply), or the pathway of the movement of the temporary bonding position 10E of the main vacuum plate 10. The adjusting unit 19 is so constructed that it will adjust the leading edge of the assembly 1B to be supplied in a direction in which it will come into intimate contact with the temporary bonding portion 10E. the adjuster 19 is composed of a fluid conveying pipe 19A That extends transversely to the direction in which the assembly 1B is supplied and a plurality of fluid blowing holes 19B made in this pipe 19A.

The fluid conveying pipe 19A has a hollow interior and will permit the passage of a fluid therethrough at a pressure higher that atmospheric pressure. In the embodiment under discussion, the fluid conveying pipe 19A is shown to have a generally circular cross-section but the cross-sectional shape of this pipe is not limited to a circle and may be rectangular or elliptical.

The fluid blowing holes 19B are disposed in such a manner that a fluid will be blown against the assembly 1B in a direction that ensures proper adjustment of the assembly 1B (i.e., in the direction of arrow G in FIG. 4).

Air is typically used as a fluid in the film adjuster 19. Alternatively, gases such as inert gases may be used as fluids.

As described above, in the laminator of the present invention, the thin film adjusting unit 19 which adjusts the leading edge of the assembly 1B to be supplied toward the thermobonding roller 16 in which it is brought into intimate contact with the temporary bonding portion 10E is mounted in the laminator body 7 (or support member 12 or front-stage conveyor 17) in an area near the pathway of the movement of the bonding portion 10E. This arrangement assures the leading edge of the assembly 1B to be brought into intimate contact with the bonding portion 10E so that said leading edge can be temporarily thermocompression bonded onto the conductive layer on the insulating substrate 11 in a reliable manner.

As shown in FIGS. 1 and 4, a thin film projecting unit 20 is mounted in the laminator body 7 (or front-stage conveyor 17 or support member 12) in an area near the assembly 1B (or 1B') that is supplied between the lower sucking portion 13b of the sub-vacuum plate 13 and the rotary vacuum plate 15. This projecting unit 20 is so constructed that it will form the slack assembly 1B' in a direction in which it will be brought into intimate contact with the thermo-compression roller 16. The unit 20 is composed of a fluid conveying pipe 20A extending transversely to the direction in which the assembly 1B is supplied and a plurality of fluid blowing holes 20B made in this pipe 20A.

The fluid conveying pipe 20A has a hollow interior and will permit the passage of a fluid therethrough at a pressure higher than atmospheric pressure. The fluid conveying pipe 20A is shown to have a generally circular cross-section but the cross.-sectional shape of this pipe is not limited to a circle and may be rectangular or elliptical.

The fluid blowing holes 20B are disposed in such a manner that a fluid will be blown against the assembly 1B' in a direction in which its slack will protrude in the way already described above (i.e., in the direction of an arrow H in FIG. 4).

As in the case of thin film adjusting unit 19, air is typically used as a fluid in the film projecting unit 20. Alternatively, gases such as inert gases or liquids such as water and oil may be used as fluids.

As described above, in the laminator of the present invention, the thin film projecting unit 20 which adjusts the slack assembly 1B' to project in a direction in which it is brought into intimate contact with the thermo-compression roller 16 is mounted in the laminator body 7 (or support member 12 or front-stage conveyor 17) in an area near the assembly 1B'. This arrangement enables the assembly 1B' to become slack in a direction in which it can be reliably brought into intimate contact with the thermo-compression roller 16 and a particularly notable advantage that results from this fact is that the trailing edge of the assembly 1B can be reliably sucked onto the rotary vacuum plate 15. Consequently, the trailing edge of the assembly 1B can be thermo-compression laminated over the conductive layer on the insulating substrate 11 in a reliable manner without developing any wrinkles or other surface defects.

In the present invention, the thin film adjusting unit 19 or thin film projecting unit 20 may be constructed of a plurality of fluid blowing nozzles that are provided transversely to the direction of the supply of assembly 1B and through which a fluid will be blown against the assembly 1B in such a manner that it will be adjusted or allowed to project in the appropriate direction defined in the preceding paragraph.

Alternatively, the adjusting unit 19 or projecting unit 20 may be constructed of a suction pipe extending transversely to the direction in which the assembly 1B is supplied and a plurality of suction holes that are made in this pipe and through which a vacuum is drawn to have the assembly 1B adjusted or project in the already defined appropriate direction.

If desired, each of the units 19 and 20 may be constructed of a projecting member that enables the assembly 1B to be adjusted or project in the specified appropriate direction.

In the present invention, the film adjusting unit 19 may serve as the film projecting unit 20, or vice versa.

A substrate guide member 21 is mounted on the laminator body 7 (or rear-stage conveyor 18) in an area between the thermo-compression roller 16 and a transport roller 18A in the rear-stage conveyor 18 as shown in FIGS. 1 and 4. This guide member 21 is so constructed that the substrate 11 over which the assembly 1B has been thermocompression laminated will be guided from the laminating position to where the transport rollers 18A and 18B are positioned. The guide member 21 may be in an interdigital form of bars that extend in the direction of conveyance of the substrate 11 and which are arranged transversely to that direction of conveyance. The interdigital guide member 21 is capable of guiding the substrate 11 smoothly by reducing the area of contact and, hence, by reducing the frictional resistance with the substrate 11.

The advantage of incorporating the substrate guide member 21 between the thermo-compression roller 16 and the transport roller 18A in the rear-stage conveyor 18 is obvious when the substrate 11 is thin because it can be guided and conveyed to transport rollers 18A and 18B in a reliable manner without sagging at the leading edge after the assembly 1B has been laminated to each o its sides by thermo-compression. This effectiveness of the substrate guide member 21 is particularly great in the laminator of the embodiment under discussion, in which the thermocompression roller 16 is shifted from the position indicated by dashed line 16' to the one indicated by the solid line for the temporary bonding of the assembly 1B. This shifting results in the creation of a considerable space between the roller 16 and the transport roller 18A but the substrate 11 can travel through this space smoothly by virtue of guidance by the member 21.

In the present invention, the substrate guide member 21 may be formed of a screen.

Alternatively, the member 21 be formed of a solid plate.

The method of laminating the assembly 1B by thermo-compression with the laminator of the embodiment being discussed is hereinafter described briefly with reference to FIGS. 1, 4 and 17 through 19 (enlarged view showing each of the essential steps).

In the first step, the leading edge of the assembly 1B which has been separated from the protective film 1A on the separating roller 3 is manually positioned between the sub-vacuum plate 13 and the cutting unit 14. A vacuum source is operated to hold and such the assembly 1B by the main vacuum plate 10 and the sub-vacuum plate 13. Then, the cutter 14 is is used to out the assembly 1B and to remove the unnecessary part away.

Figure 17:
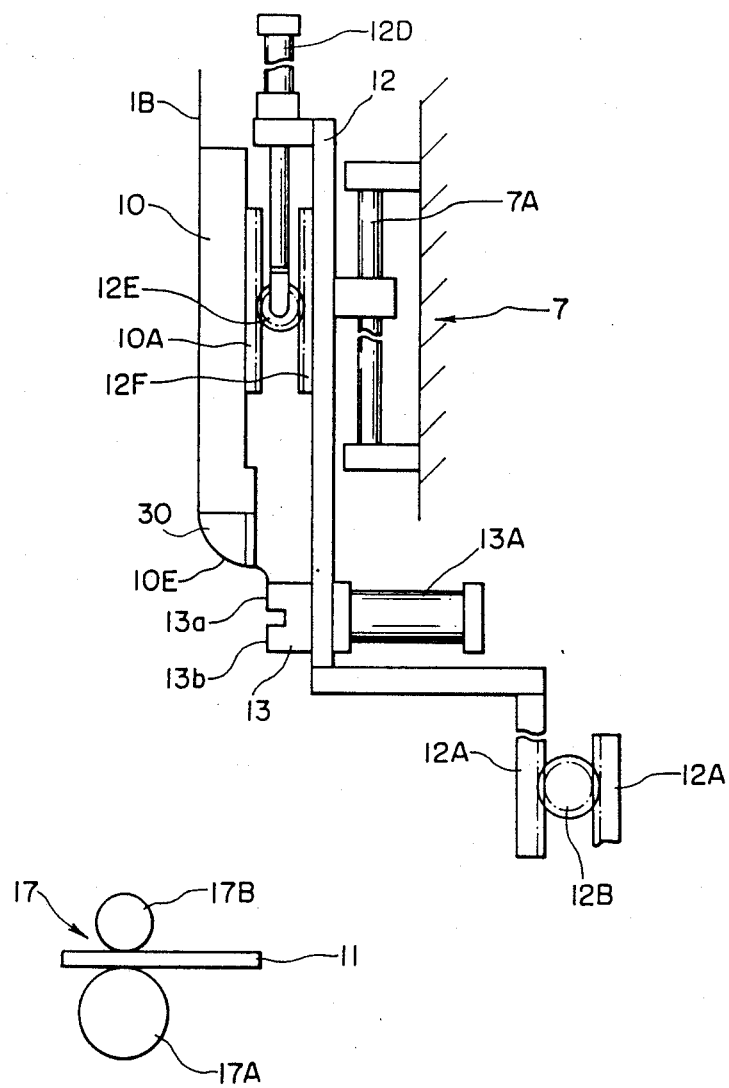

In the next step, the insulating substrate 11 is conveyed over transport rollers 17A and 17B in the front-stage conveyor 17. When the leading edge of the substrate 11 reaches the temporary bonding position, the leading edge of the assembly 1B is sucked onto the surface of the sub-vacuum plate 13. Thereafter, the drive source 13A is actuated to move the sub-vacuum plate 13 away from the pathway of the supply of assembly 1B so that the leading edge of the assembly will be sucked to the temporary bonding portion 10E as shown in FIG. 17. As it is sucked to the main vacuum plate 10 and the temporary bonding portion 10E, the assembly 1B undergoes adjustment by the thin film adjusting unit 19 so that the leading edge of the assembly can be readily sucked to the temporary bonding portion 10E.

Figure 18:
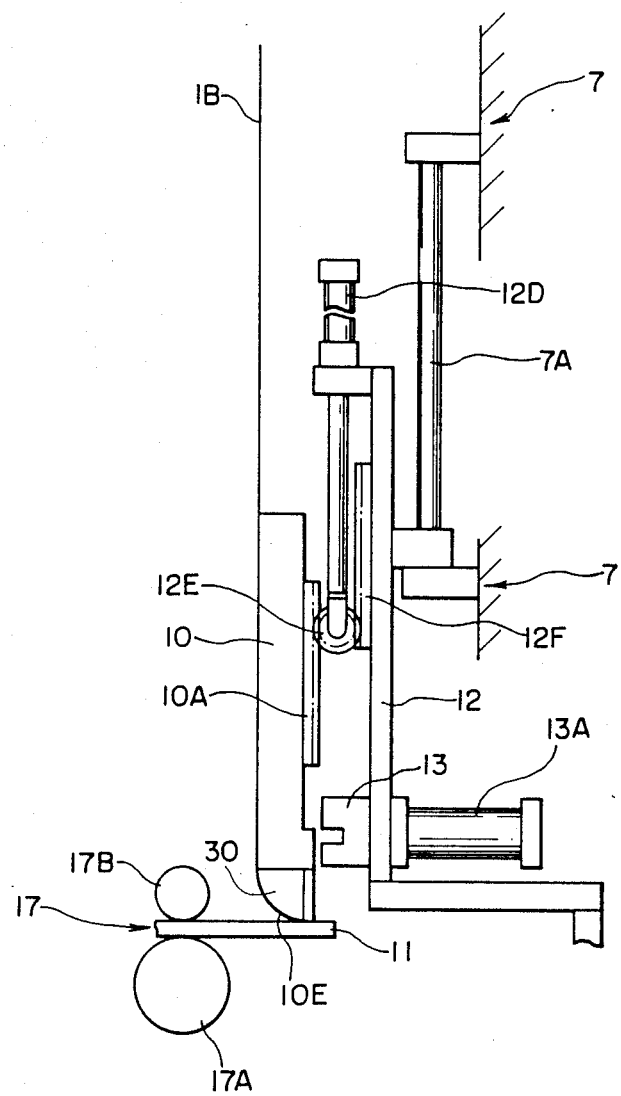

The main vacuum plate 10 is further moved with respect to the support member 12 by means of the drive source 12D, so that leading end of the assembly lB which is sucked by the temporary bonding portion 10E shown in FIG. 18 is temporarily bonded (temporality thermocompressed) to the conductive layer on the insulating substrate 11.

After the assembly 1B has been temporarily bonded to the substrate 11, the operation of sucking by the main vacuum plate 10 and temporary bonding portion 10E is turned off and the drive source 12C and 12D are actuated to cause each of the main vacuum plate 10, temporary bonding portion 10E and the sub-vacuum plate 13 to move away from the temporary bonding position.

This movement away from the temporary bonding position is much larger than the movement during the step in which the assembly 1B is sucked to the temporary bonding portion 10E, and the movement being made by the drive source 12C to move the main vacuum plate 10 and the sub-vacuum plate 13. This moving length is proportional to the slacking amount of the assembly 1B'. In this case, the drive source 12C of the support member 12 can be made compact in size or the drive source 12C can provide increased drive power to perform high speed operation, since the cutting unit 14 is fixed in the laminator body 7 as described above.

In a subsequent step, the thermo-compression rollers 16 are shifted from the position indicated by the dashed line 16' to the temporary bonding position indicated by the solid line. As the rollers 16 are rotated over both sides of the insulating substrate 11 with the leading edge of the assembly 1B being temporarily bonded thereto, said assembly is thermo-compression laminated to the conductive layer of the substrate 11. In this step, the operation of sucking by the main vacuum plate 10, temporary bonding portion 10E, and sub-vacuum plate 13 is all turned off, so that each of the thermocompression rollers 16 will be automatically supplied with the assembly 1B from the feed roller 2 by the rotating force of rollers 16 and the retaining force provided by the rollers 16 and the substrate 11.

When a given amount of assembly 1B has been laminated on the substrate 11 by thermo-compression, the action of sucking by the main vacuum plate 10, sub-vacuum plate 13 and rotary vacuum plate 15 is started substantially simultaneously. The support member 12 is moved by the drive source 12C from a position shown in FIG. 19, and the assembly 1B is supplied to the insulating substrate 11 by the main vacuum plate 10, and at the same time, the trailing end (cutting position) of the assembly 1B is brought into alignment with the cutting position of the cutter unit 14 by means of the lower vacuum portion 13b of the sub-vacuum plate 13. The supply speed of the assembly 1B (moving speed of the support member 12) is so set as to be faster than the speed at which it is thermocompression laminated over the substrate 11 by rollers 16 (or the peripheral speed of the rollers 16).

Figure 19:
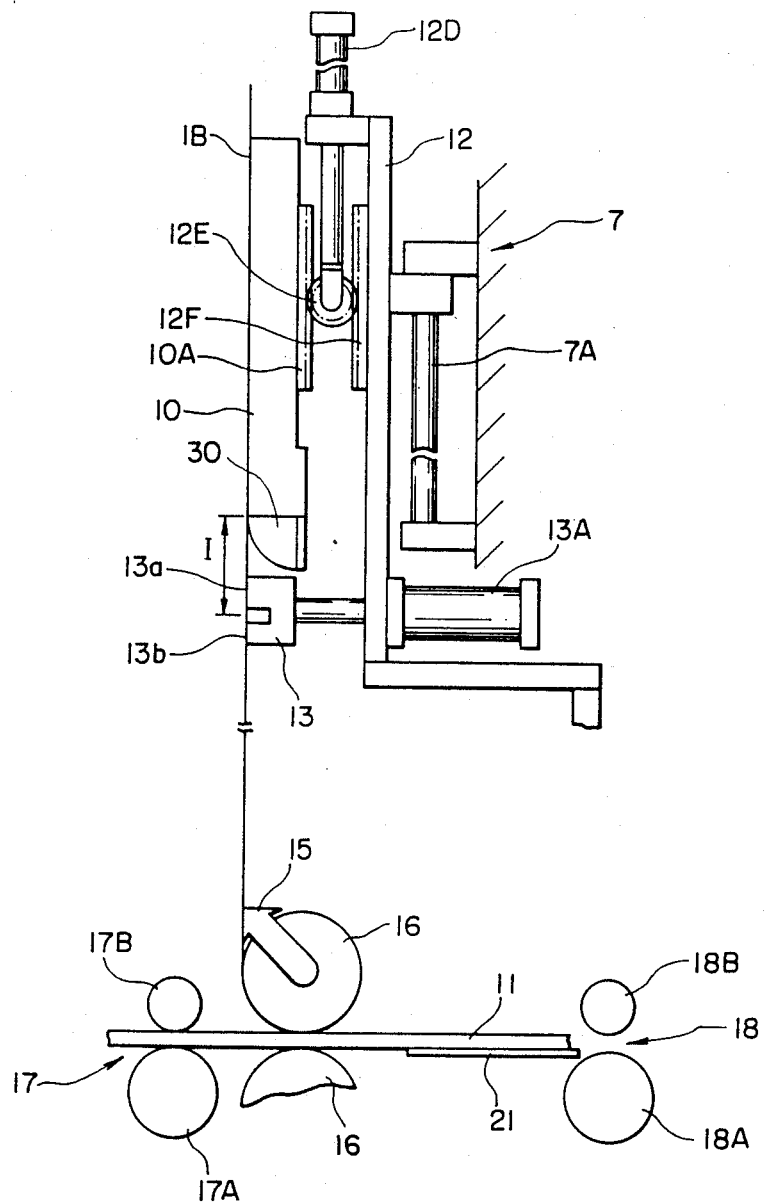

In the present invention, the main vacuum plate 10 and the sub-vacuum plate 13 are mounted to the support member 12, and the support member 12 is disposed in the laminator body 7 in such a manner that the support member moves toward and away from the insulating substrate 11. Therefore, trailing end (cutting position) of the assembly 1B is sucked to the sub-vacuum plate 13 simultaneous with the sucking operation of the main vacuum plate 10, and the main vacuum plate 10 and the sub-vacuum plate 13 are moved by the support member 12 so as to align the cutting position of the assembly 1B with the cutting position of the cutting unit 14. As a result, no surplus slack is generated in the assembly 1B between the main vacuum plate 10 and the sub-vacuum plate 13. That is, the distance I defined between the main vacuum plate 10 and the position to which the disc like cutter 14C of the sub-vacuum plate 13 is applied (U-shaped portion) shown in FIG. 19 is not changed even in the state where the cutting position of the assembly 1B is in alignment with the cutting position of the cutter unit 14 as shown in FIG. 4. Therefore, the cutting position of the assembly 1B is correctly aligned with the cutting position of the cutting unit 14, and the assembly 1B can be cut to a precise dimension corresponding to the dimension of insulating substrate 11. Accordingly, precise thermo-compression lamination is effected to thus provide high yieldability. Moreover, the support member 12 provided with the main vacuum plate 10 and the sub-vacuum plate 13 can be driven by the drive source having small driving capacity, since the cutting unit 14 is fixed to the laminator body 7.

After the supply of the assembly 1B and alignment of its cutting position with the cutting position of the cutter unit 14, a slack assembly 1B' can be formed between the sub-vacuum plate 10 and the rotary vacuum plate 15. The trailing and leading edges of the slack assembly 1B' as seen in the direction of its supply are adjusted by the thin film adjusting unit 20 in such a manner that they are reliably sucked onto the lower sucking portion 13b of the sub-vacuum plate 13 and the rotary vacuum plate 15, respectively.

While it is held in this state, the assembly 1B is cut at its trailing edge (cutting position) with the cutter unit 14 to provide a segment of a predetermined size that corresponds to the size of the substrate 11.

Subsequently, the trailing edge of the so cut assembly 1B is sucked by the rotary vacuum plate 15, which then rotates at a speed slightly slower than that of the thermo-compression roller 16 and imparts an appropriate amount of tension to that part of the thin film which is defined by the area where it is laminated by rollers 16 and its trailing edge. As a result, the trailing edge of the assembly 1B can be laminate onto the conductive layer on the insulating substrate 11 without developing any surface defects such as wrinkles.

After the assembly 1B has been laminated by thermo-compression, the substrate 11 is conveyed, without any troubles, past the substrate guide member 21 to be carried through the transport rollers 18A and 18B in the rear-stage conveyor 18 by the rotating force of the thermo-compression rollers 16. the substrate 11 is further transferred from the rear-stage conveyor 18 to an adjacent exposure unit.

While the present invention has been described above in detail with reference to a specific embodiment, it should be understood that this is not the only embodiment of the invention and that various modifications can be made without departing from the spirit and scope of the present invention. For instance, the sub-vacuum plate 13 may be composed of two independently controlled plates, one plate being used to have leading edge of the assembly 1B (as seen in the direction of its supply) sucked to the temporary bonding portion 10E, and the other plate being used as a holder of the cutting unit 14.

In another application of the laminator of the present invention, the substrate 11 is preheated in preparation for the lamination of the assembly 1B over the substrate with unheated compression rollers.

Also, the present invention way be applied to the laminator for the assembly 1B having no protective film, before the assembly is bonded to the substrate.

The laminator of the present invention can also be employed in attaching a protective film to the surface of a decorative laminated sheet used as a construction material.

As described above, according to the present invention, the temporary bonding member or the film temporary bonding member body is detachably mounted on the main vacuum plate body. Even if due to the depression of the edge portion of the film temporary bonding member against the film, the temporary bonding portion would be damaged, it is possible to remove the temporary bonding edge member away from the temporary bonding member or body. It is therefore unnecessary to replace the main vacuum plate as a whole. Thus, a service life of the apparatus as a whole may be prolonged.

Also, since the film temporary bonding member or the film temporary bonding edge member is detachably mounted on the man vacuum plate or the film temporary bonding member body through the heat insulator, the film temporary bonding member solely is heated, and the heat may be prevented from propagating to the other parts. Therefore, the light sensitive resin (photo resist) layer is prevented from being viscous, and the part to be thermobonded is solely thermobonded. Thus, it is possible to prevent the bubbles or the like from being produced in the thermobonded film.

Also, the heater receiving groove is formed in the film temporary bonding member body, and a heater source is provided at a position corresponding to to the heater source receiving groove in the film edge member. The film temporary bonding edge member is detachably mounted on the film temporary bonding member body through the heat insulator. Therefore, with such a compact structure, it is possible to heat the film bonding edge member solely and to prevent the heat from propagating to the other part by the heat insulator. It is possible to prevent the light sensitive resin (photo resist) layer from being viscous and to heat the part to be thermobonded.

We claim:

1. A device for temporarily bonding a film onto a substrate for a laminator, comprising:
   means for supplying the film along a supply path;
   a film temporary bonding body means;
   a film temporary bonding edge means for temporarily bonding the film, to be bonded onto the substrate, in pressing contact with the film;
   means for detachably coupling said film temporary bonding edge means and said film temporary bonding means to each other;
   a first heat insulator means for providing heat insulation, said first heat insulator means being interposed between said film temporary bonding body means and said film temporary bonding edge means;
   means for detachably coupling said film temporary bonding body means and said film supplying means to each other; and
   a second heat insulator means for providing heat insulation, said second heat insulator means being interposed between said film supplying means and said film temporary bonding body means, wherein said film supplying means includes first hole means for sucking the film, and said film temporary bonding body means includes second hole means for sucking the film, further comprising separate vacuum means for said first and second hole means and independent control means for independently controlling operations of said first and second hole means.

2. A laminator for bonding a film onto a substrate, comprising:

film supplying means for supplying the film along a supply path;

film temporary bonding means for temporarily bonding the film, to be bonded onto the substrate, said film temporary bonding means including a film temporary bonding body, a film temporary bonding edge member for temporarily bonding the film, to be bonded onto the substrate, in pressing contact with the film, said film temporary bonding edge member being detachably provided on said film temporary bonding body, and a first heat insulator, said first heat insulator being interposed between said film temporary bonding body and said film temporary bonding edge member, said temporary bonding body being detachably provided at a leading end of said film supply path of said film supply means; and a second insulator interposed between said film means and said film temporary bonding body; and film sucking holes formed in said film supply means and said film temporary bonding body wherein said holes formed in said film supply means and said holes formed in said film temporary bonding body are connected to independent fluid sucking means so as to independently suck fluid in said film.

3. The laminator of claim 2, wherein said film temporary bonding means includes a heater, and said film temporary bonding body has a heater receiving recess, said heater being provided in said film temporary bonding edge member at a position corresponding to said heater receiving recess.

4. The laminator of claim 3, wherein said film temporary bonding edge member has a relatively thin elongated bonding area.

5. The laminator of claim 4, wherein the width of said elongated bonding area is approximately 1.5 mm.

6. A laminator for bonding a film onto a substrate, comprising:

means for supplying said film along a supply path;

film temporary bonding means for temporarily bonding said film to said substrate, wherein said film temporary bonding means comprises:

a film temporary bonding body disposed at a leading end of said film supply means;

a temporary bonding edge member detachably connected to said film temporary bonding body, wherein said temporary bonding edge member presses said film so as to temporarily bond it to said substrate;

a first heat insulating means disposed between said edge member and said film temporary bonding body;

a second heat insulating means disposed between said film supply means and said film temporary bonding body;

a heater receiving recess disposed in said film temporary bonding body;

a heater provided in said temporary bonding edge member so as to be disposed within said heater receiving recess when said temporary bonding edge member is attached to said film temporary bonding body;

a plurality of first film sucking passages disposed between said film temporary bonding member and said first heat insulating means; and second film sucking passages disposed in said film temporary bonding member, said second film sucking passages having their outlets interconnected via a film sucking groove disposed on the outer surface of said film temporary bonding member.

* * * * *